(12) United States Patent
Heinsoo et al.

(10) Patent No.: US 11,979,146 B2
(45) Date of Patent: May 7, 2024

(54) TUNABLE RESONATOR-RESONATOR COUPLING CIRCUIT AND QUANTUM COMPUTING APPARATUS COMPRISING THEREOF

(71) Applicant: IQM FINLAND OY, Espoo (FI)

(72) Inventors: Johannes Heinsoo, Espoo (FI); Jani Tuorila, Espoo (FI)

(73) Assignee: IQM Finland Oy, Espoo (FI)

( * ) Notice: Subject to any disclaimer, the term of this patent is extended or adjusted under 35 U.S.C. 154(b) by 0 days.

(21) Appl. No.: 18/374,867

(22) Filed: Sep. 29, 2023

(65) Prior Publication Data
US 2024/0030913 A1  Jan. 25, 2024

Related U.S. Application Data

(63) Continuation of application No. PCT/FI2021/050538, filed on Jul. 21, 2021.

(51) Int. Cl.
*H03K 17/92* (2006.01)
*G06N 10/40* (2022.01)
*H10N 69/00* (2023.01)

(52) U.S. Cl.
CPC .............. *H03K 17/92* (2013.01); *G06N 10/40* (2022.01); *H10N 69/00* (2023.02)

(58) Field of Classification Search
CPC ..................................................... H03K 17/92
USPC ......................................................... 327/528
See application file for complete search history.

(56) References Cited

PUBLICATIONS

Sete et al., "Floating tunable coupler for scalable quantum computing architectures", 2021 (Year: 2021).*
Sete et al., Floating tunable coupler for scalable quantum computing architectures, Phys. Rev. Applied 15, 12 pages, 2021.
Petrescu et al., Accurate methods for the analysis of strong-drive effects in parametric gates, Phys. Rev. Applied 19, 21 pages, 2021.
Stehlik et al., Tunable Coupling Architecture for Fixed-frequency Transmons, Phys. Rev. Lett. 127, 7 pages, 2021.
Stehlik et al., Tunable Coupling Architecture for Fixed-frequency Transmon Superconducting Qubits, Phys. Rev. Lett. 127, 6 pages, 2021.
International Search Report and Written Opinion issued in PCT/FI2021/050538, dated Apr. 11, 2022.

* cited by examiner

*Primary Examiner* — Tomi Skibinski
(74) *Attorney, Agent, or Firm* — Meunier Carlin & Curfman LLC

(57) ABSTRACT

The invention is generally related to the field of quantum computing and particularly to a tunable resonator-resonator coupling circuit that provides both direct and indirect couplings between linear or nonlinear resonators. The indirect coupling is provided by using a tunable coupling element that comprises two ungrounded superconducting islands. Since the superconducting islands are ungrounded, it is possible to provide different signs of coupling frequencies for the resonators and the superconducting islands, which in turn allows the interaction between the first and second resonators to be controlled more efficiently. Moreover, the design, calibration, and operation of the circuit with such a tunable coupling element are significantly easier and simpler compared to the existing analogues, while providing the same or even better performance. A quantum computing apparatus using one or more such circuits is also provided.

10 Claims, 7 Drawing Sheets

TUNABLE RESONATOR-RESONATOR COUPLING CIRCUIT AND QUANTUM COMPUTING APPARATUS COMPRISING THEREOF

CROSS-REFERENCE TO RELATED APPLICATIONS

This application is a continuation of International patent application No. PCT/FI2021/050538, filed on Jul. 21, 2021, and entitled, "TUNABLE RESONATOR-RESONATOR COUPLING CIRCUIT AND QUANTUM COMPUTING APPARATUS COMPRISING THEREOF," the disclosure of which is expressly incorporated herein by reference in its entirety.

FIELD OF THE INVENTION

The invention is generally related to the field of quantum computing. In particular, the invention is related to a tunable resonator-resonator coupling circuit, as well as to a quantum computing apparatus using one or more such circuits.

BACKGROUND OF THE INVENTION

A quantum computing device, also referred to as a quantum computer, uses quantum mechanical phenomena, such as superposition and entanglement, to perform required quantum computing operations. Unlike a conventional computer that manipulates information in the form of bits (e.g., "1" or "0"), the quantum computer manipulates information using qubits. A qubit may refer not only to a basic unit of quantum information but also to a quantum device that is used to store one or more qubits of information (e.g., the superposition of "0" and "1").

The quantum computer may be implemented based on superconducting circuits comprising superconducting qubits and/or resonators. Tunable interaction between the superconducting qubits or resonators is desirable for most of the quantum computing operations (e.g., large-scale quantum computation and simulation). It may be achieved by inserting an extra circuit element between the superconducting qubits or resonators, namely a tunable coupler which allows states of the superconducting qubits or resonators to interact with each other in a controlled manner. In other words, the tunable coupler arranged between the superconducting qubits or resonators allows one to implement a quantum gate.

A variety of tunable couplers have previously been designed and demonstrated experimentally. For example, according to one existing tunable-coupler setup, two superconducting qubits are capacitively coupled both directly and indirectly. The indirect interaction is mediated by the tunable coupler itself. If the tunable coupler is implemented as a single-island transmon, the sign of the indirect interaction is different than that of the direct interaction at coupler frequencies that are higher than qubit frequencies. Consequently, the direct and indirect coupling terms may cancel each other at a certain coupler frequency (also referred to as an idling frequency). However, in this tunable-coupler setup, the idling frequency is always above the qubit frequencies, which may adversely affect the operation speed and accuracy of two-qubit gates implemented based on such a tunable coupler.

SUMMARY

This summary is provided to introduce a selection of concepts in a simplified form that are further described below in the detailed description. This summary is not intended to identify key features of the invention, nor is it intended to be used to limit the scope of the invention.

The objective of the invention is to provide a technical solution that enables a tunable coupling between linear or nonlinear resonators.

The objective above is achieved by the features of the independent claims in the appended claims. Further embodiments and examples are apparent from the dependent claims, the detailed description and the accompanying drawings.

According to a first aspect, a tunable resonator-resonator coupling circuit is provided. The circuit comprises a first resonator and a second resonator. The first resonator is linear or nonlinear, and the second resonator is linear or nonlinear. The first resonator and the second resonator have a direct coupling therebetween. The circuit further comprises a tunable coupling element arranged to provide an indirect coupling between the first resonator and the second resonator. The tunable coupling element comprises a first superconducting island and a second superconducting island which are both ungrounded. The indirect coupling comprises: (i) a first coupling between the first resonator and the first superconducting island, (ii) a Josephson coupling between the first superconducting island and the second superconducting island, and (iii) a second coupling between the second resonator and the second superconducting island. Since the superconducting islands are floating, i.e. ungrounded, it is possible to provide different signs of coupling frequencies for the resonators and the superconducting islands, which in turn allows the interaction between the first and second resonators to be controlled more efficiently. Moreover, the design, calibration, and operation of the circuit according to the first aspect are significantly easier and simpler compared to the existing analogues, while providing the same or even better performance.

In one embodiment of the first aspect, each of the first resonator and the second resonator is linear and implemented as one of a harmonic oscillator, a coplanar waveguide resonator and a lumped element resonator. These linear resonators may be used as quantum busses, or they may be used to store qubit states. In this embodiment, the tunable coupler may allow on-demand transfer of quantum information between the linear resonators.

In another embodiment of the first aspect, each of the first resonator and the second resonator is implemented as a superconducting qubit. This may allow one to implement a two-qubit gate based on the circuit according to the first aspect.

In one embodiment of the first aspect, the direct coupling is implemented as a non-galvanic (e.g., capacitive or inductive) coupling between the first resonator and the second resonator. Such a capacitive coupling may increase the circuit performance.

In one embodiment of the first aspect, the first coupling is implemented as a capacitive coupling between the first resonator and the first superconducting island, and the second coupling is implemented as a capacitive coupling between the second resonator and the second superconducting island. Such capacitive couplings are easier to implement by using conventional technologies compared, for example, to inductive couplings.

In one embodiment of the first aspect, the tunable coupling element is implemented as a transmon qubit. The transmon qubit is less sensitive to a control noise and a signal noise compared to other standard qubit implementations.

In one embodiment of the first aspect, the first resonator has a first frequency and the second resonator has a second frequency. In this embodiment, the tunable coupling element has an idling frequency that is below each of the first frequency and the second frequency. Since the idling frequency of the whole coupling element is below the frequencies of the resonators, it is possible to design the coupling element such that its sweet spot is located at (or close to) the operation point of a two-qubit gate implemented by using superconducting qubits as the nonlinear resonators in the circuit according to the first aspect. This may reduce gate errors arising from the decoherence of the coupling element.

In one embodiment of the first aspect, the circuit further comprises a first readout resonator and a second readout resonator. The first readout resonator is configured to readout the first resonator and has a first operating frequency. The second readout resonator is configured to readout the second resonator and has a second operating frequency. Each of the first operating frequency and the second operating frequency is above each of the idling frequency of the tunable coupling element, the first frequency of the first resonator, and the second frequency of the second resonator. In this case, the coupling element will not be resonant with the readout resonators during the circuit operation (or gate operation if the resonators are represented by superconducting qubits), which would otherwise adversely affect the whole circuit operation.

In one embodiment of the first aspect, the indirect coupling further comprises a third coupling between the second resonator and the first superconducting island and a fourth coupling between the first resonator and the second superconducting island. By using these additional couplings, it is possible to increase the applicability and flexibility of the circuit according to the first aspect.

In one embodiment of the first aspect, the third coupling is implemented as a capacitive coupling between the second resonator and the first superconducting island, and the fourth coupling is implemented as a capacitive coupling between the first resonator and the second superconducting island. By using such capacitive couplings, it is possible to make the circuit according to the first aspect more compact.

In one embodiment of the first aspect, at least one of the first superconducting island and the second superconducting island has a capacitive coupling to a ground. This may allow the tunable coupling element to be shielded from other circuit elements, thereby reducing crosstalk.

According to a second aspect, a quantum computing apparatus is provided. The apparatus comprises at least one circuit according to the first aspect and a control unit configured to perform quantum computing operations by using the at least one circuit. By using such one or more tunable resonator-resonator coupling circuits in the quantum computing apparatus, one may increase the computational accuracy and processing speed of the quantum computing apparatus.

Other features and advantages of the invention will be apparent upon reading the following detailed description and reviewing the accompanying drawings.

BRIEF DESCRIPTION OF THE DRAWINGS

The invention is explained below with reference to the accompanying drawings in which.

DETAILED DESCRIPTION

Figure 1:
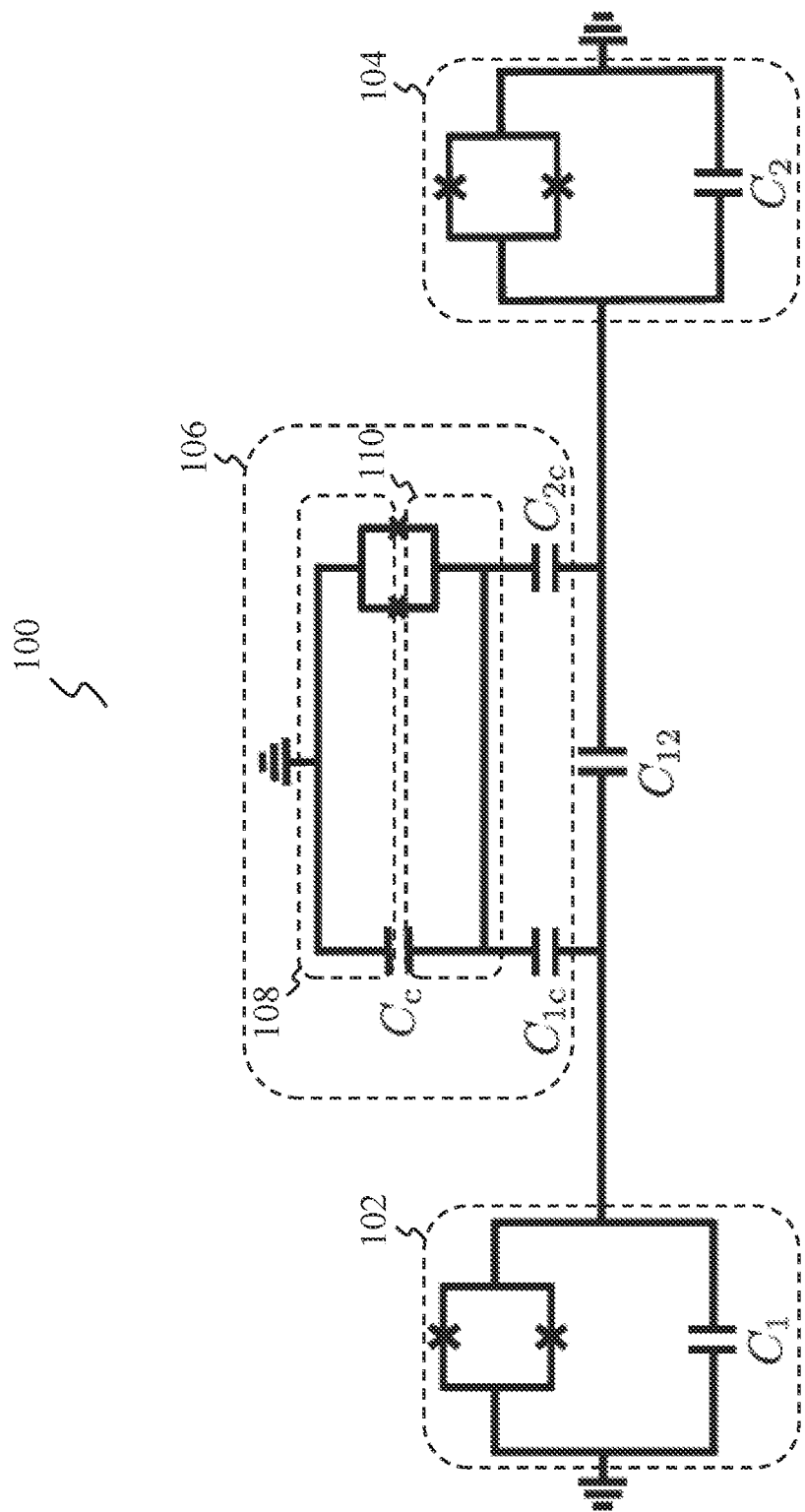
FIG. 1 shows a block diagram of a tunable qubit-qubit coupling circuit in accordance with the prior art.

Various embodiments of the invention are further described in more detail with reference to the accompanying drawings. However, the invention may be embodied in many other forms and should not be construed as limited to any certain structure or function discussed in the following description. In contrast, these embodiments are provided to make the description of the invention detailed and complete.

According to the detailed description, it will be apparent to the ones skilled in the art that the scope of the invention encompasses any embodiment thereof, which is disclosed herein, irrespective of whether this embodiment is implemented independently or in concert with any other embodiment of the invention. For example, the circuits and apparatus disclosed herein may be implemented in practice by using any numbers of the embodiments provided herein. Furthermore, it should be understood that any embodiment of the invention may be implemented using one or more of the elements presented in the appended claims.

The word "exemplary" is used herein in the meaning of "used as an illustration". Unless otherwise stated, any embodiment described herein as "exemplary" should not be construed as preferable or having an advantage over other embodiments.

Any positioning terminology, such as "left", "right", "upper", "lower", etc., may be used herein for convenience to describe one element's or feature's relationship to one or more other elements or features in accordance with the figures. It should be apparent that the positioning terminology is intended to encompass different orientations of the circuit disclosed herein, in addition to the orientation(s) depicted in the figures. As an example, if one imaginatively rotates the circuit in the figures 90 degrees clockwise, elements or features described as "left" and "right" relative to other elements or features would then be oriented, respectively, "above" and "below" the other elements or features. Therefore, the positioning terminology used herein should not be construed as any limitation of the invention.

Although the numerative terminology, such as "first", "second", etc., may be used herein to describe various embodiments and the features thereof, it should be understood that the embodiments and the features thereof should not be limited by this numerative terminology. This numerative terminology is used herein only to distinguish one embodiment or feature from another embodiment or feature. Thus, a first embodiment discussed below could be called a second embodiment and vice versa, without departing from the teachings of the invention.

As used in the embodiments disclosed herein, a tunable resonator-resonator coupling circuit may refer to a quantum circuit in which linear or nonlinear resonators are coupled to each other in a controlled manner. One non-restrictive example of the linear resonators may include a harmonic oscillator which is well-known in the art (for this reason, its description is omitted herein). One non-restrictive example of the nonlinear resonators may include a superconducting qubit.

As used in the embodiments disclosed herein, the superconducting qubit may refer to a superconducting quantum device configured to store one or more quantum bits of information (or qubits for short). In this sense, the superconducting qubit serves as a quantum information storage and processing device. The source of nonlinearity in the superconducting qubit may be represented by one or more Josephson junctions. The term "Josephson junction" is used herein in its ordinary meaning and may refer to a quantum mechanical device made of two superconducting electrodes which are separated by a barrier (e.g., a thin insulating tunnel barrier, normal metal, semiconductor, ferromagnet, etc.).

According to the embodiments disclosed herein, a quantum computing apparatus, also referred to as a quantum computer, may refer to an apparatus that is configured to perform different quantum computing operations (e.g., qubit operations, such as reading the state of a superconducting qubit, initializing the state of the superconducting qubit, and entangling the state of the superconducting qubit with the states of other superconducting qubits in the quantum computing apparatus, etc.) by using the tunable resonator-resonator coupling circuit disclosed herein. Existing implementation examples of such quantum computing apparatuses may include superconducting quantum computers, trapped ion quantum computers, quantum computers based on spins in semiconductors, quantum computers based on cavity quantum electrodynamics, optical photon quantum computers, quantum computers based on defect centers in diamond, etc.

It should be noted that there are many tunable qubit-qubit coupling circuits (also referred to as tunable couplers) in the prior art. They are mainly used to implement quantum gates and allow the states of the qubits to interact with each other in a controlled manner. Some of the existing tunable qubit-qubit coupling circuits are discussed below with reference to FIGS. 1-3.

FIG. 1 shows a block diagram of a tunable qubit-qubit coupling circuit 100 in accordance with the prior art. The circuit 100 comprises a first superconducting qubit 102, a second superconducting qubit 104, and a tunable coupling element 106. The first superconducting qubit 102 and the second superconducting qubit 104 are grounded and implemented similar to each other, i.e. each of them comprises a parallel connection of a capacitor ($C_1$ or $C_2$, respectively) and two Josephson junctions (schematically shown as crosses in FIG. 1). The first superconducting qubit 102 and the second superconducting qubit 104 are directly coupled to each other via a capacitor $C_{12}$. Additionally, the first superconducting qubit 102 and the second superconducting qubit 104 are indirectly coupled to each other via the tunable coupling element 106. The tunable coupling element 106 comprises a grounded superconducting portion 108 and a superconducting island 110. It should be noted that the term "superconducting island" used herein may refer to a circuit component having all its parts galvanically connected to each other with an insignificant self-inductance at all operating frequencies of the circuit. The (upper) grounded superconducting portion 108 is provided on one side of a capacitor $C_c$ and the two Josephson junctions, while the (lower) superconducting island 110 is provided on another side of the capacitor $C_c$ and the two Josephson junctions. Thus, there is a Josephson coupling between the grounded superconducting portion 108 and the superconducting island 110. Furthermore, the superconducting island 110 is ungrounded or floating, and is coupled to the first superconducting qubit 102 via a capacitor $C_{1c}$ and to the second superconducting qubit 104 via a capacitor $C_{2c}$.

The Josephson junctions used in the circuit 100 provide the anharmonicity of the first and second superconducting qubits 102, 104 and the tunable coupling element 106. However, if the first and second superconducting qubits 102, 104 and the tunable coupling element 106 all have a negative anharmonicity (which is usually observed in case of such a transmon regime), this may lead to the following problems:

the idling frequency of the tunable coupling element 106 is above the qubit frequencies of the superconducting qubits 102, 104;

the tunable coupling element 106 may become resonant with readout resonators (which may be additionally connected to the circuit 100) during the operation of the circuit 100 if the readout resonators have frequencies that are above the qubit frequencies;

during the operation of the circuit 100, the decoherence of the tunable coupling element 106 may also lead to a situation that the operating frequency of the tunable coupling element 106 is far away from its flux sweet spot (It should be noted that the sweet spot is a frequency of the tunable coupling element 106, which is first-order insensitive to a tuning parameter. The tuning parameter may be represented by a magnetic field flux through a Superconducting Quantum Interference Device (SQUID) loop for transmon qubits, and by a charge bias for Cooper-Pair Box (CPB) qubits. For example, in case of using transmons with a symmetric SQUID, the sweet spot is at a maximum qubit frequency); and coupling with higher excited states of the tunable coupling element 106 may reduce the operation speed of the circuit 100.

Figure 2:
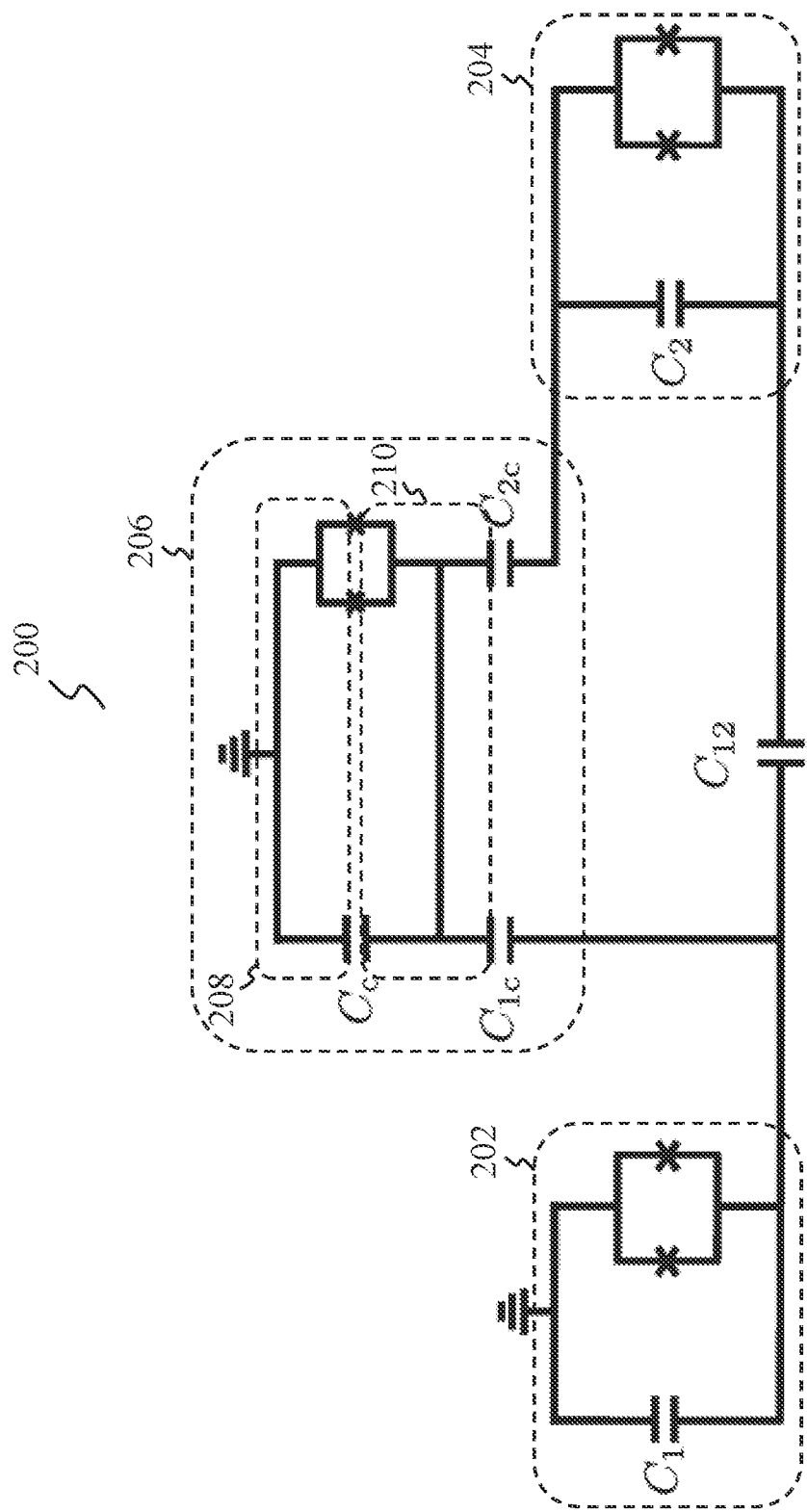
FIG. 2 shows a block diagram of another tunable qubit-qubit coupling circuit in accordance with the prior art.

FIG. 2 shows a block diagram of a tunable qubit-qubit coupling circuit 200 in accordance with the prior art. Similar to the circuit 100, the circuit 200 comprises a first superconducting qubit 202, a second superconducting qubit 204, and a tunable coupling element 206. The first superconducting qubit 202 is implemented similar to the first superconducting qubit 102 and the second superconducting qubit 104. In particular, the first superconducting qubit 202 is grounded and comprises a parallel connection of a capacitor $C_1$ and two Josephson junctions. At the same time, unlike the circuit 100, the second superconducting qubit 204 is ungrounded and therefore connected in the circuit 200 differently as compared to the connection of the first superconducting qubit 202. The tunable coupling element 206 comprises a grounded superconducting portion 208 and a (ungrounded) superconducting island 210 which are provided in the circuit 200 in the same manner as the grounded superconducting portion 108 and the superconducting island 110, respectively, in the circuit 100. The first superconducting qubit 202 and the second superconducting qubit 204 are also directly coupled to each other via a capacitor $C_{12}$ and indirectly coupled to each other via the tunable coupling element 206. The indirect coupling is provided via capacitors $C_{1c}$ and $C_{2c}$. However, the circuit 200 lacks some benefits which may be provided if one replaces the grounded superconducting portion 208 with an ungrounded superconducting island.

Figure 3:
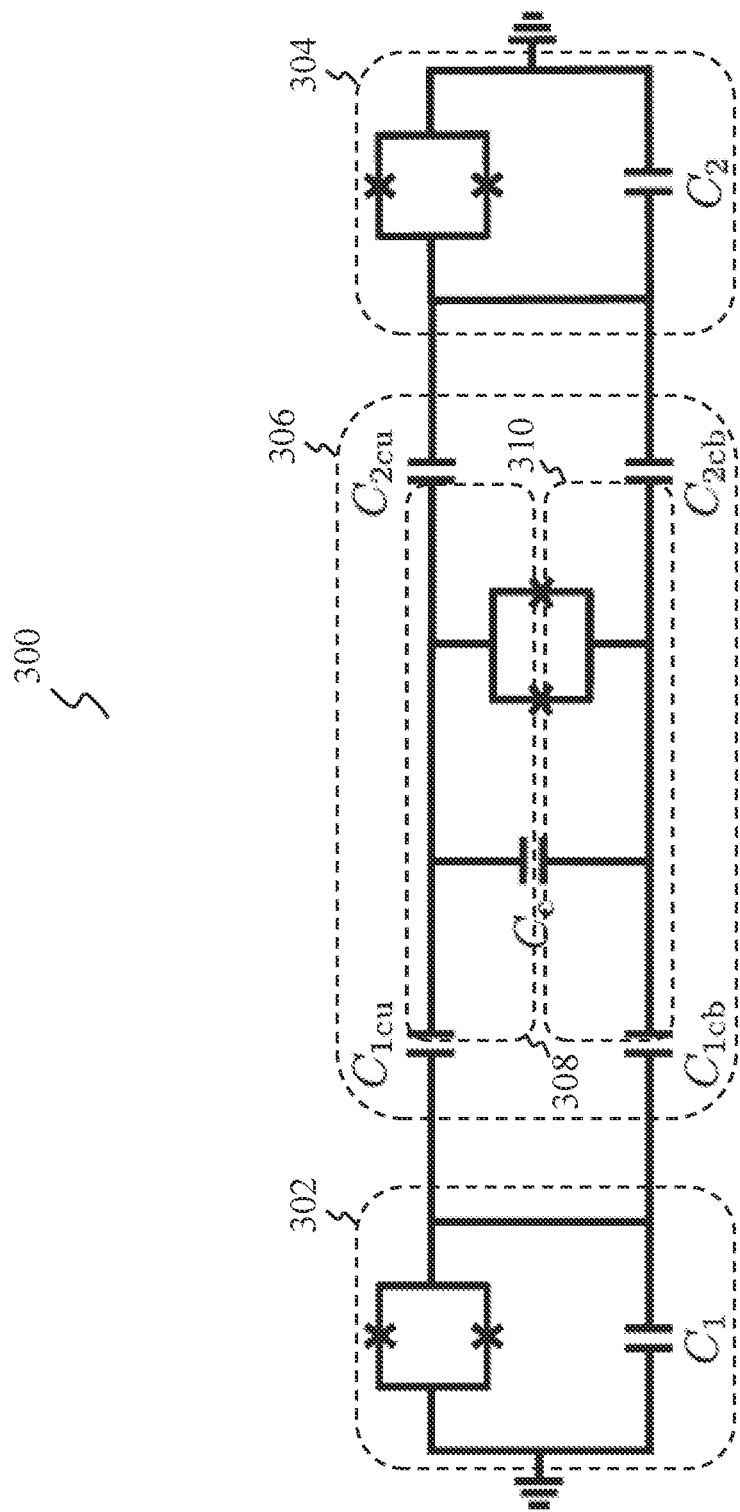
FIG. 3 shows a block diagram of yet another tunable qubit-qubit coupling circuit in accordance with the prior art.

FIG. 3 shows a block diagram of a tunable qubit-qubit coupling circuit 300 in accordance with the prior art. Similar to the circuit 100 and the circuit 200, the circuit 300 comprises a first superconducting qubit 302, a second superconducting qubit 304, and a tunable coupling element 306. The first superconducting qubit 302 and the second superconducting qubit 304 are implemented similar to the first superconducting qubit 102 and the second superconducting qubit 104, respectively, in the circuit 100. However, the tunable coupling element 306 is connected between the first superconducting qubit 302 and the second superconducting qubit 304 differently as compared to the tunable coupling elements 106, 206. More specifically, the tunable coupling element 306 is provided in the circuit 300 such that there is no direct coupling between the first superconducting qubit 302 and the second superconducting qubit 304. The first superconducting qubit 302 and the second superconducting qubit 304 are only indirectly coupled to each other via a first superconducting island 308 and a second superconducting island 310 which are both included in the tunable coupling element 306. The first superconducting island 308 and the second superconducting island 310 are both ungrounded, with each of them being coupled to the first superconducting qubit 302 and the second superconducting qubit 304 via capacitors $C_{1cu}$, $C_{2cu}$, $C_{1cb}$, and $C_{2cb}$. At the same time, there is a Josephson coupling between the first superconducting island 308 and the second superconducting island 310. However, the circuit 300 lacks the effective direct qubit-qubit coupling. For example, due to the lack of the capacitor $C_{12}$ (like in the circuit 100 or 200), the two-qubit gates based on the circuit 300 may have a limited operation speed compared to a similar circuit with such a capacitor. Moreover, in some practical scalable multi-qubit systems, it is not possible to arrange sufficiently large capacitors $C_{1cu}$ and $C_{1cb}$ to provide the fast two-qubit gates.

The exemplary embodiments disclosed herein provide a technical solution that allows mitigating or even eliminating the above-sounded drawbacks of the prior art. In particular, the technical solution disclosed herein involves providing both direct and indirect couplings between linear or nonlinear resonators in a quantum circuit. The indirect coupling is provided by using a tunable coupling element that comprises two ungrounded superconducting islands. Since the superconducting islands are ungrounded, it is possible to provide different signs of coupling frequencies for the resonators and the superconducting islands, which in turn allows the interaction between the first and second resonators to be controlled more efficiently. Moreover, the design, calibration, and operation of the quantum circuit with such a tunable coupling element are easier compared to the existing analogues, while providing the same or even better performance.

Figure 4:
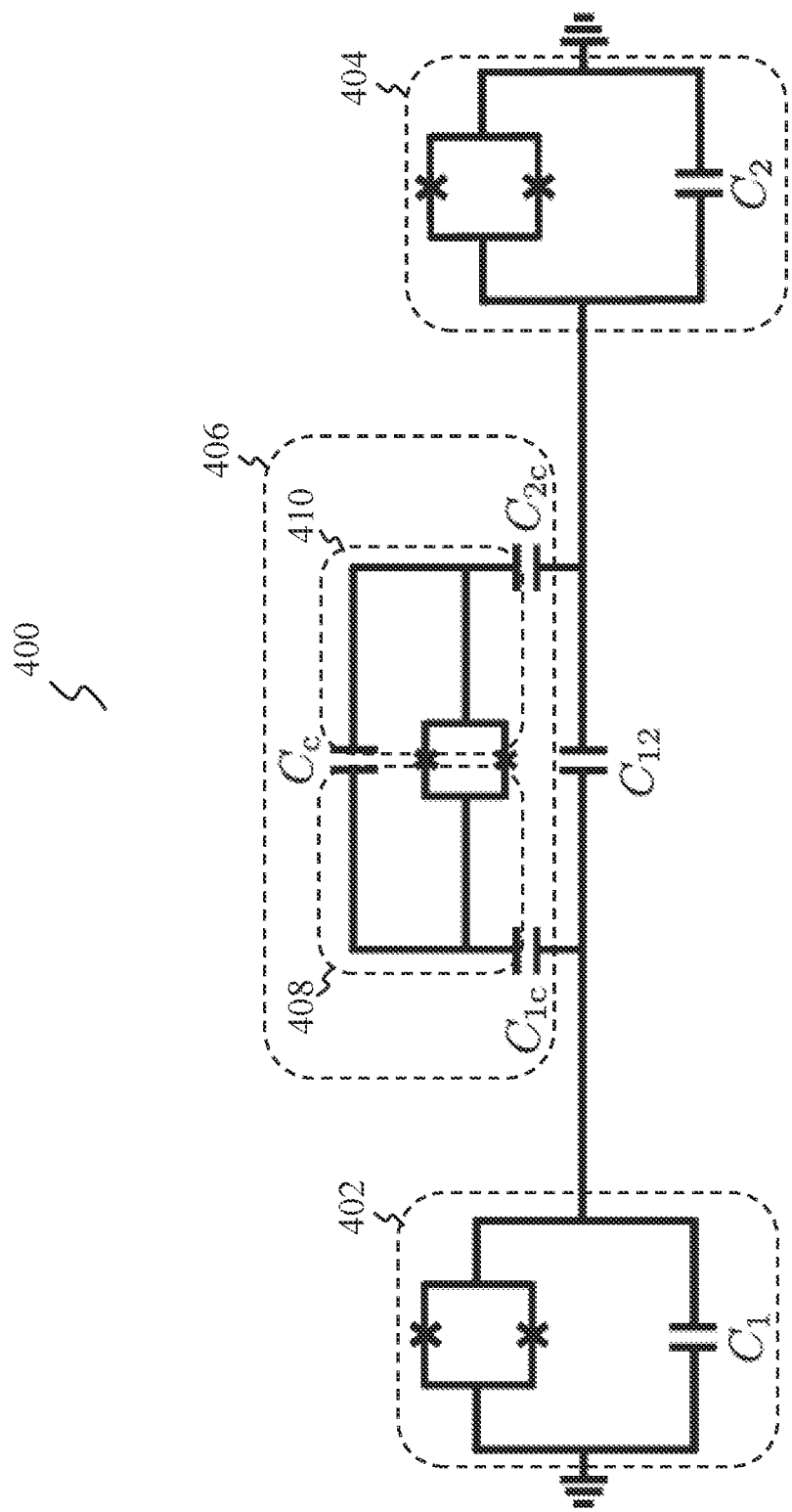
FIG. 4 shows a block diagram of a tunable resonator-resonator coupling circuit in accordance with a first exemplary embodiment of the invention.

FIG. 4 shows a block diagram of a tunable resonator-resonator coupling circuit 400 in accordance with a first exemplary embodiment of the invention. The circuit 400 comprises a first nonlinear resonator 402, a second nonlinear resonator 404, and a tunable coupling element 406. In this exemplary embodiment, each of the first and second nonlinear resonators 402 and 404 is implemented as a superconducting qubit (similar to those shown in FIG. 1). For this reason, the circuit 400 may be used to implement a two-qubit gate. However, the circuit 400 is not limited to this application and, for example, may be used to implement gates based on two or more linear resonators (e.g., harmonic oscillators, as will be described below with reference to FIG. 5), or the circuit 400 may be used to implement quantum gates between qutrits (in a three-level quantum system) or qudits (in a d-level quantum system). The qudits and qutrits are supported by the nonlinear resonators since they have an infinite amount of energy levels. It should be also noted that the qubits may be formed if one restricts the operation of the nonlinear resonator to two lowest energy eigenstates.

Referring back to FIG. 4, the first superconducting qubit 402 and the second superconducting qubit 404 are directly coupled to each other via a capacitor $C_{12}$ and indirectly coupled to each other via the tunable coupling element 406. The tunable coupling element 406 comprises a first superconducting island 408 and a second superconducting island 410 which are both ungrounded. Moreover, the first superconducting island 408 and the second superconducting island 410 are arranged in the circuit 400 such that each of them is directly coupled only to one of the first superconducting qubit 402 and the second superconducting qubit 404. More specifically, there are a first non-galvanic coupling between the first superconducting qubit 402 and the first superconducting island 408 and a second non-galvanic coupling between the second superconducting qubit 404 and the second superconducting island 410. The first and second non-galvanic couplings are both capacitive, i.e. implemented via capacitors $C_{1c}$ and $C_{2c}$, respectively. However, in some other embodiments, at least one of the first non-galvanic coupling, the second non-galvanic coupling, and the direct coupling between the first and second superconducting qubits 402 and 404 may be inductive, if required and depending on particular applications. Moreover, in some other embodiments, the direct coupling itself may be implemented as a galvanic coupling, and at least one of the first non-galvanic coupling and the second non-galvanic coupling may be replaced with a galvanic coupling. The first superconducting island 408 and the second superconducting island 410 are coupled to each other via Josephson junctions (see the crosses in FIG. 4), i.e. have a Josephson coupling therebetween. Thus, the indirect coupling between the first superconducting qubit 402 and the second superconducting qubit 404 comprises the above-mentioned first non-galvanic coupling, Josephson coupling, and second non-galvanic coupling.

As can be seen in FIG. 4, the arrangement area of the first superconducting island 408 is confined by one plate of the capacitor $C_{1c}$, one plate of a capacitor $C_c$, and the two Josephson junction. As for the second superconducting island 410, its arrangement area is confined by one plate of the capacitor $C_{2c}$, another plate of the capacitor $C_c$, and the two Josephson junctions. Such arrangements of the first superconducting island 408 and the second superconducting island 410 are given by way of example only. In some other embodiments, the first superconducting island 408 and the second superconducting island 410 may be arranged such that the indirect coupling between the first and second superconducting qubits 402 and 404 comprises an additional third (galvanic or non-galvanic) coupling between the second superconducting qubit 404 and the first superconducting island 408 and an additional fourth (galvanic or non-galvanic) coupling between the first superconducting qubit 402 and the second superconducting island 410. Again, the third and fourth couplings may be capacitive or inductive, if required and depending on particular applications. By using these additional couplings, it is possible to increase the applicability and flexibility of the circuit 400. Additionally, one or both of the superconducting islands 408 and 410 may also have a coupling to the ground via additional capacitors.

Furthermore, the tunable coupling element 406 may be configured such that its idling frequency is below qubit frequencies of the first and second superconducting qubits 402 and 404. In this case, the tunable coupling element 406 may have a sweet spot located at (or close to) the operation point of a two-qubit gate (which is implemented based on the circuit 400). This may reduce gate errors arising from the decoherence of the coupling element 406.

In one embodiment, the tunable coupling element 406 may be implemented as a transmon qubit. By using the transmon qubit as a "mediator" between the first and second superconducting qubits 402 and 404, it is possible to reduce sensitivity to a charge noise.

In one embodiment, the circuit 400 may further comprise a first readout resonator and a second readout resonator (which are not shown in the figures). The first readout resonator is configured to readout the first resonator and has a first operating frequency. The second readout resonator is configured to readout the second resonator and has a second operating frequency. Each of the first operating frequency and the second operating frequency may be set a value higher than the value of the operating frequency of the tunable coupling element 406. In this case, during the operation of the circuit 400, there is no resonance between the tunable coupling element 406 and the readout resonators, which would otherwise adversely affect the operation of the circuit 400.

Figure 5:
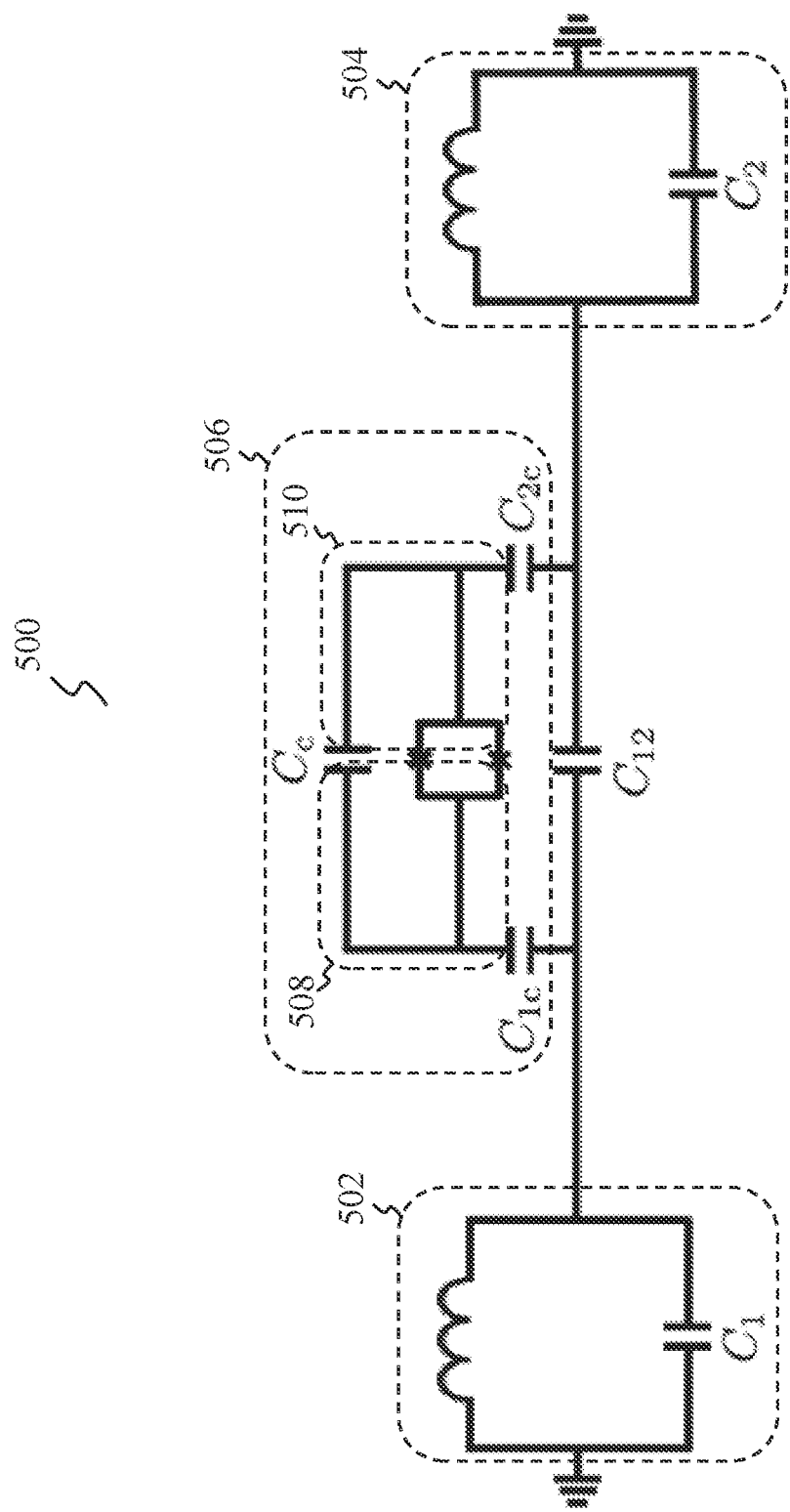
FIG. 5 shows a block diagram of a tunable resonator-resonator coupling circuit in accordance with a second exemplary embodiment of the invention.

FIG. 5 shows a block diagram of a tunable resonator-resonator coupling circuit 500 in accordance with a second exemplary embodiment of the invention. The circuit 500 comprises a first linear resonator 502, a second linear resonator 504, and a tunable coupling element 506. The tunable coupling element 506 comprises a first superconducting island 508 and a second superconducting island 510, which are implemented and arranged in the same manner as the first superconducting island 408 and the second superconducting island 410, respectively, in the circuit 400. At the same time, the circuit 500 differs from the circuit 400 by the presence of the linear resonators (but not the nonlinear resonators). In particular, the first and second linear resonators 502 and 504 are schematically shown as harmonic oscillators in FIG. 5. In some other embodiments, at least one of the first and second linear resonators 502 and 504 may be implemented as a coplanar waveguide resonator or a lumped element resonator. The circuit 500 may have similar advantages as the circuit 400, and the embodiments discussed above in respect of the circuit 400 may be equally related to the circuit 500.

Figure 6:
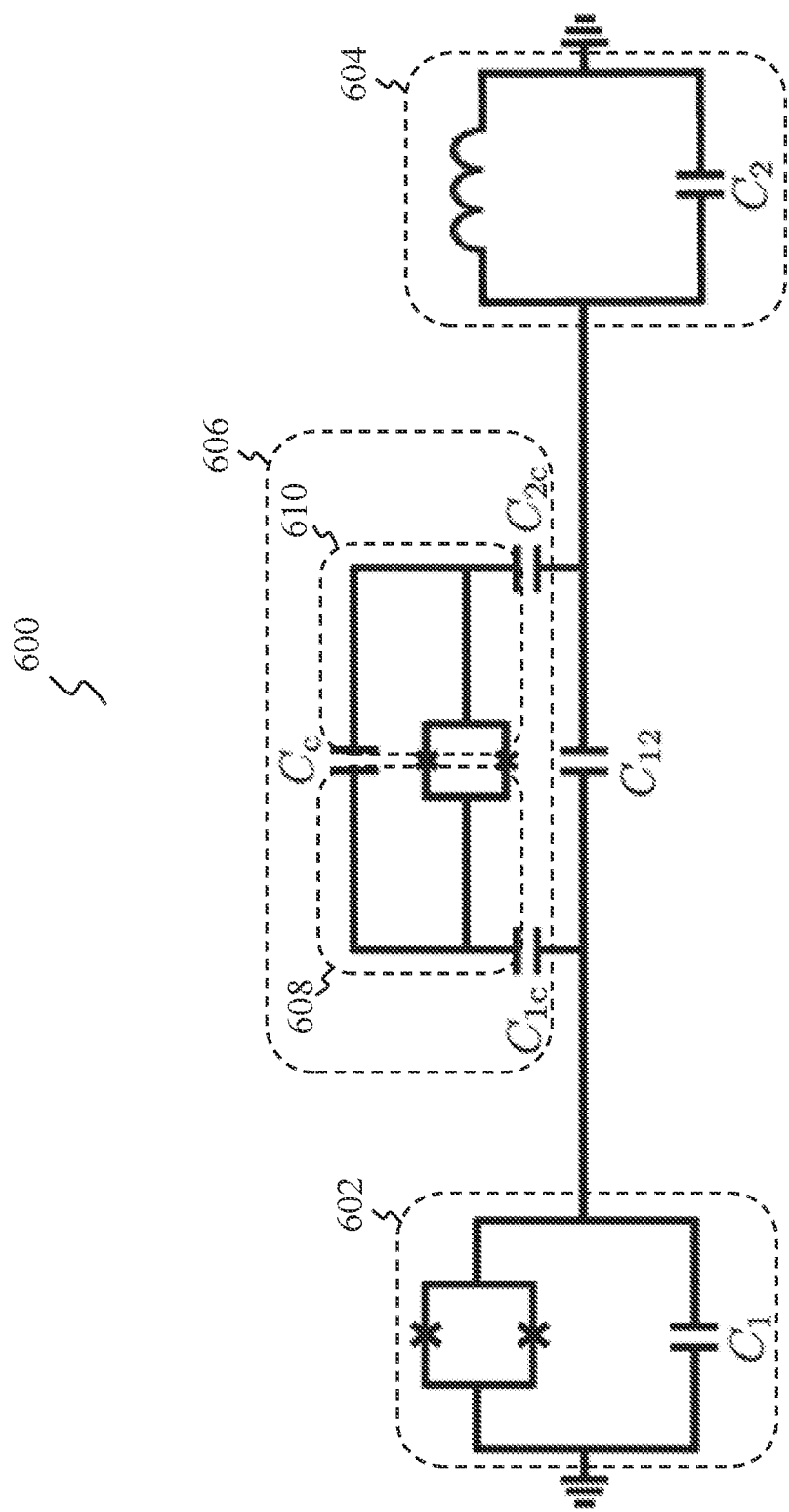
FIG. 6 shows a block diagram of a tunable resonator-resonator coupling circuit in accordance with a third exemplary embodiment of the invention.

FIG. 6 shows a block diagram of a tunable resonator-resonator coupling circuit 600 in accordance with a third exemplary embodiment of the invention. The circuit 600 comprises a first resonator 602, a second resonator 604, and a tunable coupling element 606. The tunable coupling element 606 comprises a first superconducting island 608 and a second superconducting island 610, which are implemented and arranged in the same manner as the superconducting islands in the circuit 400 or the circuit 500. At the same time, the circuit 600 differs from the circuit 400 and the circuit 500 in that the first resonator 602 and the second resonator 604 are of different types. More specifically, the first resonator 602 is nonlinear and implemented as a superconducting qubit, while the second resonator 604 is linear and implemented as a harmonic oscillator. It should be apparent that, if required, the first resonator 602 may be of linear type, while the second resonator 604 may be of nonlinear type. In the circuit 600, the second resonator 604 (i.e. the harmonic oscillator) may be used as a quantum bus for the first resonator 602 (i.e. the superconducting qubit), which may be very valuable in some applications.

Figure 7:
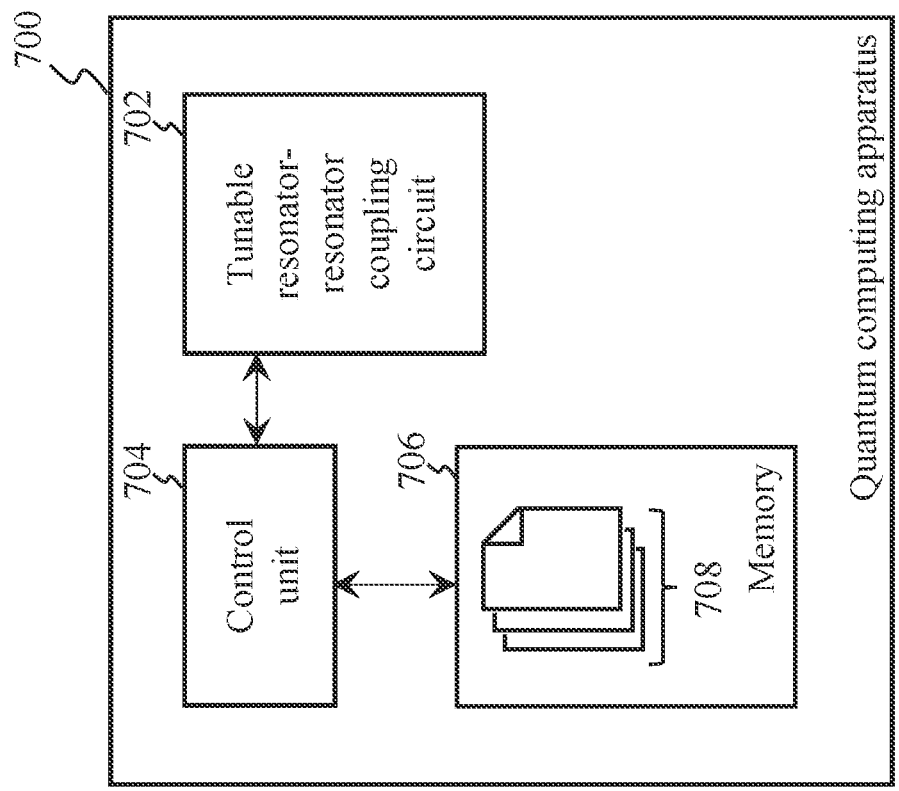
FIG. 7 shows a block diagram of a quantum computing apparatus in accordance with one exemplary embodiment of the invention.

FIG. 7 shows a block diagram of a quantum computing apparatus 700 in accordance with one exemplary embodiment of the invention. The apparatus 700 comprises a tunable resonator-resonator coupling circuit 702 and a control unit 704. The circuit 702 may be implemented as one of the circuits 400, 500 and 600. The control unit 704 is configured to perform quantum computing operations by using the circuit 702. The apparatus 700 may further comprise a memory 706 storing executable instructions 708 which, when executed by the control unit 704, may cause the control unit 704 to perform the quantum computing operations. The control unit 704 may also store the result(s) of the quantum computing operations to the memory 706. It should be noted that the number, arrangement and interconnection of the constructive elements constituting the apparatus 700, which are shown in FIG. 7, are not intended to be any limitation of the present disclosure, but merely used to provide a general idea of how the constructive elements may be implemented within the apparatus 700. For example, the apparatus 700 may comprise two or more circuits 702 each implemented as the circuit 400, 500 or 600, or may comprise any combination of the circuits 400, 500 and 600, depending on the quantum computing operations to be performed.

The control unit 704 may refer a central processing unit (CPU), general-purpose processor, single-purpose processor, microcontroller, microprocessor, application specific integrated circuit (ASIC), field programmable gate array (FPGA), digital signal processor (DSP), complex programmable logic device, etc. It should be also noted that the control unit 704 may be implemented as any combination of one or more of the aforesaid. As an example, the control unit 704 may be a combination of two or more microprocessors.

The memory 706 may be implemented as a classical nonvolatile or volatile memory used in the modern electronic computing machines. As an example, the nonvolatile memory may include Read-Only Memory (ROM), ferroelectric Random-Access Memory (RAM), Programmable ROM (PROM), Electrically Erasable PROM (EEPROM), solid state drive (SSD), flash memory, magnetic disk storage (such as hard drives and magnetic tapes), optical disc storage (such as CD, DVD and Blu-ray discs), etc. As for the volatile memory, examples thereof include Dynamic RAM, Synchronous DRAM (SDRAM), Double Data Rate SDRAM (DDR SDRAM), Static RAM, etc.

The executable instructions 708 stored in the memory 706 may be configured as a computer executable code which causes the control unit 704 to perform the quantum computing operations by using the circuit 702. The computer executable code for carrying out the quantum computing operations may be written in any combination of one or more programming languages, such as Java, C++, or the like. In some examples, the computer executable code may be in the form of a high-level language or in a pre-compiled form, and be generated by an interpreter (also pre-stored in the memory 706) on the fly.

Although the exemplary embodiments of the invention are described herein, it should be noted that various changes and modifications could be made in the embodiments of the invention, without departing from the scope of legal protection which is defined by the appended claims. In the appended claims, the word "comprising" does not exclude other elements or operations, and the indefinite article "a" or "an" does not exclude a plurality. The mere fact that certain measures are recited in mutually different dependent claims does not indicate that a combination of these measures cannot be used to advantage.

The invention claimed is:

1. A tunable resonator-resonator coupling circuit comprising:
   a first resonator, the first resonator being linear or nonlinear;
   a second resonator, the second resonator being linear or nonlinear, the first resonator and the second resonator having a direct coupling therebetween;
   a tunable coupling element arranged to provide an indirect coupling between the first resonator and the second resonator, wherein the first resonator has a first frequency and the second resonator has a second frequency, and wherein the tunable coupling element has an idling frequency that is below each of the first frequency and the second frequency;
   a first readout resonator configured to readout the first resonator, the first readout resonator having a first operating frequency; and
   a second readout resonator configured to readout the second resonator, the second readout resonator having a second operating frequency,
   wherein each of the first operating frequency and the second operating frequency is above each of the idling frequency of the tunable coupling element, the first frequency of the first resonator and the second frequency of the second resonator,
   wherein the tunable coupling element comprises a first superconducting island and a second superconducting island which are both ungrounded, and
   wherein the indirect coupling comprises: (i) a first coupling between the first resonator and the first superconducting island, (ii) a Josephson coupling between the first superconducting island and the second superconducting island, and (iii) a second coupling between the second resonator and the second superconducting island.

2. The circuit of claim 1, wherein each of the first resonator and the second resonator is implemented as one of a harmonic oscillator, a coplanar waveguide resonator and a lumped element resonator.

3. The circuit of claim 1, wherein each of the first resonator and the second resonator is implemented as a superconducting qubit.

4. The circuit of claim 1, wherein the direct coupling is implemented as a non-galvanic coupling between the first resonator and the second resonator.

5. The circuit of claim 1, wherein the first coupling is implemented as a capacitive coupling between the first resonator and the first superconducting island, and the second coupling is implemented as a capacitive coupling between the second resonator and the second superconducting island.

6. The circuit of claim 1, wherein the tunable coupling element is implemented as a transmon qubit.

7. The circuit of claim 1, wherein the indirect coupling further comprises a third coupling between the second resonator and the first superconducting island and a fourth coupling between the first resonator and the second superconducting island.

8. The circuit of claim 7, wherein the third coupling is implemented as a capacitive coupling between the second resonator and the first superconducting island, and the fourth coupling is implemented as a capacitive coupling between the first resonator and the second superconducting island.

9. The circuit of claim 1, wherein at least one of the first superconducting island and the second superconducting island has a capacitive coupling to a ground.

10. A quantum computing apparatus comprising at least one tunable resonator-resonator coupling circuit according to claim 1 and a control unit configured to perform quantum computing operations by using the at least one tunable resonator-resonator coupling circuit.

* * * * *